United States Patent [19]
Yamamoto

[11] Patent Number: 5,703,518
[45] Date of Patent: Dec. 30, 1997

[54] ABSOLUTE VALUE CIRCUIT CAPABLE OF PROVIDING FULL-WAVE RECTIFICATION WITH LESS DISTORTION

[75] Inventor: Syouhei Yamamoto, Miyazaki, Japan

[73] Assignee: Oki Electric Industry Co., Ltd., Tokyo, Japan

[21] Appl. No.: 757,949

[22] Filed: Nov. 22, 1996

Related U.S. Application Data

[63] Continuation of Ser. No. 460,730, Jun. 2, 1995, abandoned.

[30] Foreign Application Priority Data

Aug. 1, 1994  [JP]  Japan ................................. 6-179999

[51] Int. Cl.$^6$ ............................................... G06G 7/25
[52] U.S. Cl. ........................ 327/354; 327/104; 307/127
[58] Field of Search ............................ 327/354, 65, 67, 327/74, 343, 345, 551, 560–563, 104, 30, 403; 307/127

[56] References Cited

U.S. PATENT DOCUMENTS

| | | | |
|---|---|---|---|
| 3,585,487 | 6/1971 | McNally | 327/30 |
| 3,611,164 | 10/1971 | Day | 327/58 |
| 4,459,493 | 7/1984 | Moore | 327/354 |
| 4,518,877 | 5/1985 | Hearn et al. | 327/354 |
| 4,704,545 | 11/1987 | Tanaka et al. | 327/30 |
| 4,899,064 | 2/1990 | Neidorff | 327/354 |
| 5,394,107 | 2/1995 | Shou et al. | 327/354 |
| 5,438,550 | 8/1995 | Kim | 327/175 |

*Primary Examiner*—Timothy P. Callahan
*Assistant Examiner*—Kenneth B. Wells
*Attorney, Agent, or Firm*—Spencer & Frank

[57] ABSTRACT

An absolute value circuit according to the present invention has a configuration wherein a switch is connected directly to an output of an amplifier and an output terminal. Owing to this configuration, the absolute value circuit can be realized which is capable of providing full-wave rectification with less distortion.

7 Claims, 3 Drawing Sheets

ABSOLUTE VALUE CIRCUIT CAPABLE OF PROVIDING FULL-WAVE RECTIFICATION WITH LESS DISTORTION

This application is a Continuation, of application Ser. No. 08/460,730, Filed Jun. 2, 1995, now abandoned.

BACKGROUND OF THE INVENTION

1. Field of the Invention:

This invention relates to an absolute value circuit for outputting the absolute value of an input voltage relative to a reference voltage. This invention further relates to a carrier-detecting absolute value circuit provided in an Integrated Circuit (hereinafter called an "IC") for a modem, for example.

2. Description of the Related Art:

A modem is provided with a receiver for communications. A carrier (carrier wave) is integrated along a time base to control the operation of the receiver. A signal proportional to the carrier is obtained from the result of the integration and the operation of the receiver is controlled based on so-obtained signal. Now, the carrier represents an AC voltage. Thus, if the carrier were integrated as it is, it would not be possible to obtain an integrated value proportional to the level of the carrier. Therefore, in an IC used for a modem, an absolute value circuit is provided at a stage prior to the circuit for integrating the carrier.

SUMMARY OF THE INVENTION

A typical object of the inventions included in the present application is to provide an absolute value circuit capable of providing full-wave rectification with less distortion.

Another object of the present invention is to provide an absolute value circuit capable of providing full-wave rectification with reduced noise.

According to one aspect of the present invention, for achieving the above typical objects, there is provided an absolute value circuit comprising an input terminal to receive an input voltage; an output terminal; an input resistor; a feedback resistor, the input resistor and the feedback resistor being coupled in series between the input and output terminals, the input resistor being coupled to the feedback resistor at an intermediate coupling node; an operational amplifier having a first input, a second input, and an amplifier output, the first input of the operational amplifier being coupled to the intermediate coupling node, the second input of the operational amplifier receiving a reference voltage; comparing means for determining whether or not the input voltage exceeds the reference voltage; and a switch to electrically couple the amplifier output to the output terminal and the feedback resistor when the reference voltage exceeds the input voltage and to electrically isolate the amplifier output from the output terminal and the feedback resistor when the input voltage exceeds the reference voltage, the switch being coupled to the comparing means.

Owing to the above construction, full-wave rectification with less distortion can be achieved.

Further, the present application discloses various other inventions made to achieve the aforementioned objects. These inventions will be understood from the appended claims, the embodiments and the accompanying drawings.

BRIEF DESCRIPTION OF THE DRAWINGS

While the specification concludes with claims particularly pointing out and distinctly claiming the subject matter which is regarded as the invention, it is believed that the invention, the objects and features of the invention and further objects, features and advantages thereof will be better understood from the following description taken in connection with the accompanying drawings in which:

DETAILED DESCRIPTION OF THE PREFERRED EMBODIMENTS

Figure 1:
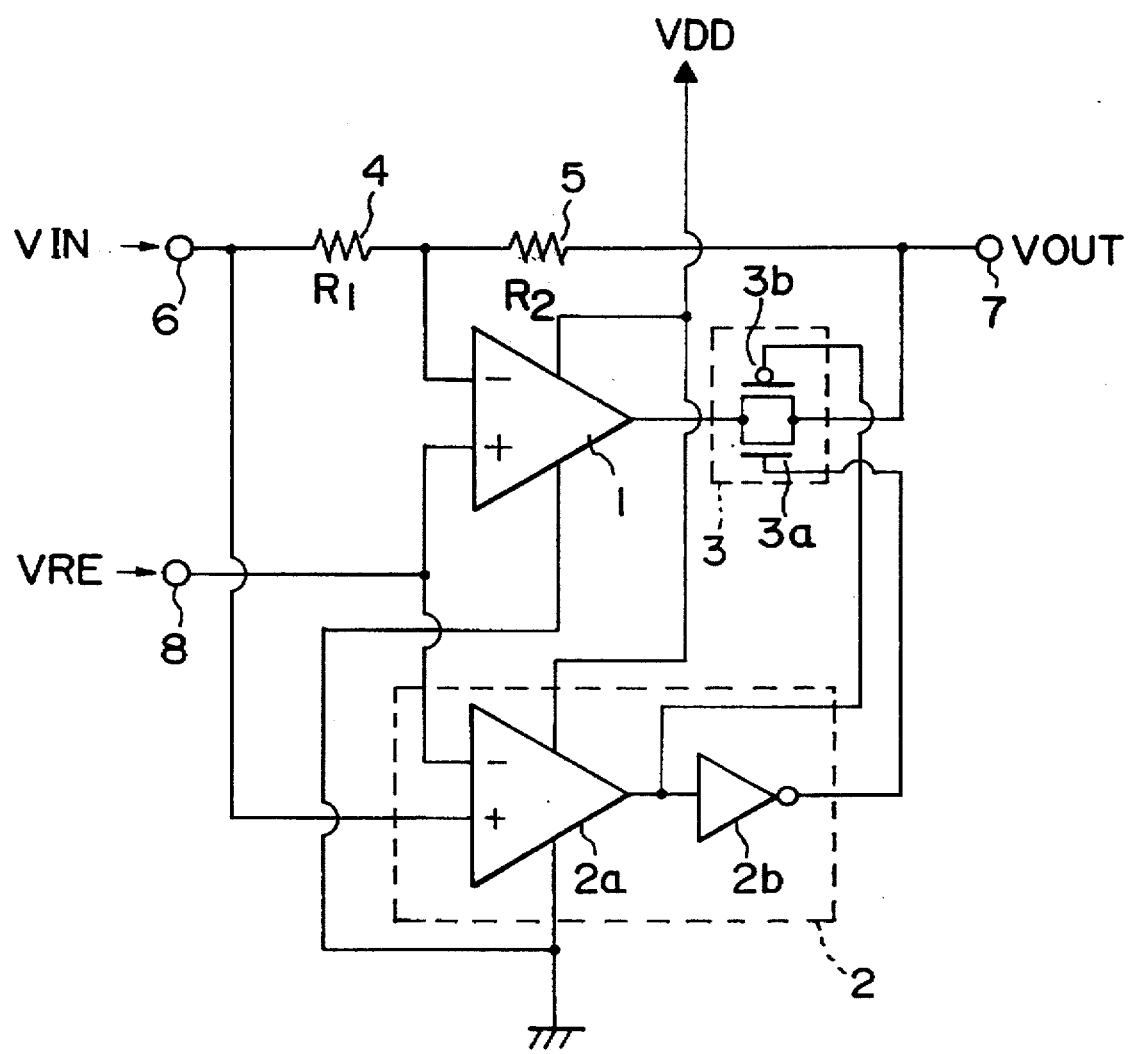
FIG. 1 is a view showing the configuration of an absolute value circuit according to a first embodiment of the present invention.

Preferred embodiments of the present invention will hereinafter be described with reference to the accompanying drawings.

A first embodiment of the present invention will first be described with reference to FIG. 1.

An absolute value circuit according to the first embodiment comprises a first Operational Amplifier (hereinafter called "Op Amp") 1; and a comparing circuit 2, a Complementary Metal Oxide Semiconductor (hereinafter called "CMOS") analog switch 3, an input resistor 4 and a feedback resistor 5.

The first Op Amp 1 includes a first source terminal; a second source terminal, a first inverting input, a first noninverting input and an output. The first source terminal is supplied with a source voltage VDD and the second source terminal is supplied with a ground voltage GND. The first noninverting input is electrically connected to a reference voltage input terminal 8. The reference voltage input terminal 8 is supplied with a reference voltage VRE.

The input resistor 4 is electrically connected to an input terminal 6 and the first inverting input.

The feedback resistor 5 is electrically connected to an output terminal 7 and the first inverting input.

The comparing circuit 2 is composed of a second Op Amp 2a and an inverter 2b. The second Op Amp 2a has a third source terminal, a fourth source terminal, a second inverting input, a second noninverting input and an output. The third source terminal is supplied with the source voltage VDD. The fourth source terminal is supplied with the ground voltage GND. The second inverting input is electrically connected to the reference voltage input terminal 8. The second noninverting input is electrically connected to the input terminal 6. The output of the second Op Amp 2a is electrically connected to the inverter 2b.

The second Op Amp 2a compares an input voltage with the reference voltage and outputs a signal having the source voltage VDD or a signal having the ground voltage GND in response to the level of the input voltage with respect to the reference voltage. Described specifically, when the input voltage is higher than the reference voltage, the second Op Amp 2a outputs the signal having the source voltage VDD therefrom. On the other hand, when the input voltage is lower than the reference voltage, the second Op Amp 2a outputs the signal having the ground voltage GND therefrom. The inverter 2b outputs a signal obtained by inverting the output signal of the second Op Amp 2a.

The CMOS analog switch 3 is connected to the output of the first Op Amp 1 and the output terminal 7.

The CMOS analog switch 3 is composed of an N-Channel Metal Oxide Semiconductor Field Effect Transistor (hereinafter called "NMOSFET") 3a and a P-Channel Metal Oxide Semiconductor Field Effect Transistor (hereinafter called "PMOSFET") 3b. The NMOSFET 3a and the PMOSFET 3b are connected in parallel to each other between the output of the first Op Amp 1 and the output terminal 7. The control electrode of the NMOSFET 3a is electrically connected to the output of the inverter 2b. The control electrode of the PMOSFET 3b is electrically connected to the output of the second Op Amp 2a.

The CMOS analog switch 3 is turned on or off in response to a signal supplied from the comparing circuit 2.

Described specifically, when the output signal of the second Op Amp 2a at the ground voltage GND and the output signal of the inverter 2b is at the source voltage VDD, the CMOS analog switch 3 is turned on. On the other hand, when the output signal of the second Op Amp 2a is at the source voltage VDD and the output signal of the inverter 2b is at the ground voltage GND, the CMOS analog switch 3 is turned off.

When the CMOS analog switch 3 is turned on, the CMOS analog switch 3 electrically connects the first Op Amp 1 and the output terminal 7 to each other. On the other hand, when the CMOS analog switch 3 is turned off, the CMOS analog switch 3 electrically disconnects the first Op Amp 1 from the output terminal 7.

The operation of the absolute value circuit according to the present invention will now be described with reference to FIG. 1 and FIGS. 3(A) and 3(B).

Figure 3A:
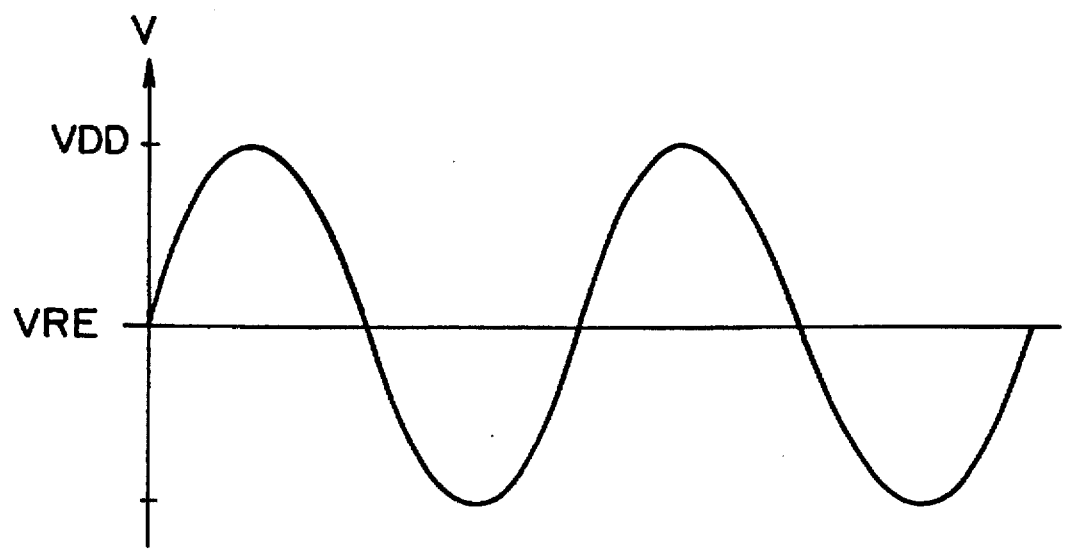
FIGS. 3A and 3B are examples of waveforms of voltages which are respectively received by and outputted from the absolute value circuits according to the first and second embodiments.

An input voltage VIN supplied to the input terminal 6 is shown in FIG. 3(A).

Now, the input voltage VIN is an alternating current that oscillates between the source voltage VDD and the ground voltage GND. Further, the reference voltage VRE is a constant voltage that meets the inequality GND (ground voltage)<VRE (reference voltage)<VDD (source voltage). In the present embodiment, the reference voltage VRE is equal to (VDD+GND)/2.

The operation of the absolute value circuit when the input voltage VIN is greater than the reference voltage VRE (i.e., VIN>VRE) will first be described.

The second Op Amp 2a outputs a signal having the source voltage VDD therefrom and the inverter 2b outputs a signal having the ground voltage GND therefrom. The control electrode of the NMOSFET 3a is supplied with the signal having the ground voltage GND and the control electrode of the PMOSFET 3b is supplied with the signal having the source voltage VDD. Thus, the CMOS analog switch 3 is turned off so as to electrically disconnect the first Op Amp 1 from the output terminal 7. As a result, the input voltage VIN is supplied to the output terminal 7 through the input resistor 4 and the feedback resistor 5, thereby appearing as the output voltage VOUT as it is. Thus, when VIN>VRE, the relationship between VOUT and VIN is established as VOUT=VIN.

The operation of the absolute value circuit when the input voltage VIN is lower than the reference voltage VRE (i.e., VIN<VRE) will next be described.

The second Op Amp 2a outputs a signal having the ground voltage GND therefrom and the inverter 2b outputs a signal having the source voltage VDD therefrom. The control electrode of the NMOSFET 3a is supplied with the signal having the source voltage VDD and the control electrode of the PMOSFET 3b is supplied with the signal having the ground voltage GND. Thus, the CMOS analog switch 3 is turned on so as to electrically connect the output of the first Op Amp 1 and the output terminal 7 to each other. Further, the output of the first Op Amp 1 is electrically connected to the feedback resistor 5. As a result, the voltage output from the first Op Amp 1 is negatively fed back to the first inverting input. Now, the CMOS analog switch 3 electrically connects the output of the first Op Amp 1 and the output terminal 7 to each other regardless of a difference in voltage between both ends (the source and drain of the CMOS analog switch 3) of the CMOS analog switch 3. Thus, a voltage up to near the source voltage VDD can be supplied to the output terminal 7.

Now, consider that the resistance value of the input resistor 4 and the resistance value of the feedback resistor 5 are set to R1 and R2 respectively. At this time, the output voltage VOUT supplied to the output terminal 7 is given by the following equation:

$$VOUT=-(VIN-VRE)\times R2/R1+VRE$$

$$\text{When } R1=R2, VOUT=-(VIN-VRE)+VRE$$

Thus, when VIN<VRE, a voltage obtained by adding a voltage corresponding to the absolute value of the difference between the input voltage VIN and the reference voltage VRE to the reference voltage VRE is supplied to the output terminal 7.

Thus, when the input voltage VIN is higher than the reference voltage VRE, the input voltage VIN is applied to the output terminal 7 as it is. On the other hand, when the input voltage VIN is lower than the reference voltage VRE, the output terminal 7 is supplied with the voltage obtained by adding the voltage equivalent to the absolute value of the difference between the input voltage VIN and the reference voltage VRE to the reference voltage.

Figure 3B:
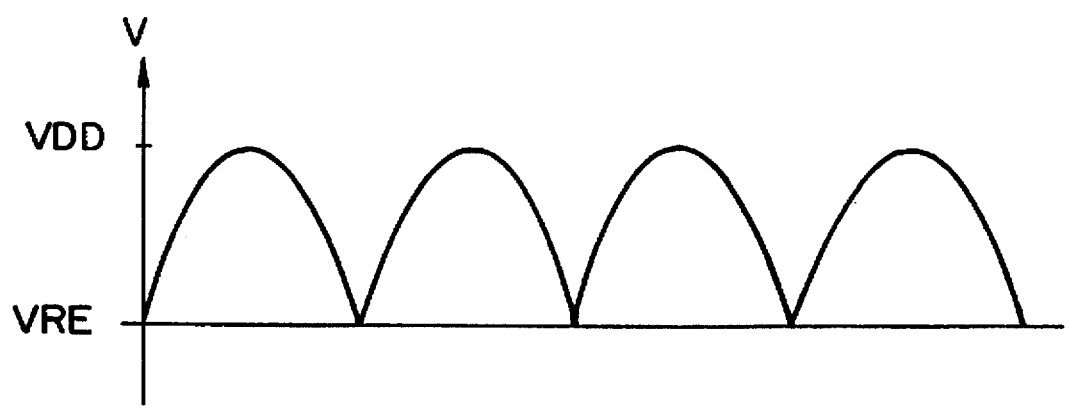

Thus, when the input voltage VIN shown in FIG. 3(A) is applied to the input terminal 6, the output voltage VOUT shown in FIG. 3(B) is supplied to the output terminal 7.

An absolute value circuit according to a second embodiment of the present invention will now be described with reference to FIG. 2.

Figure 2:
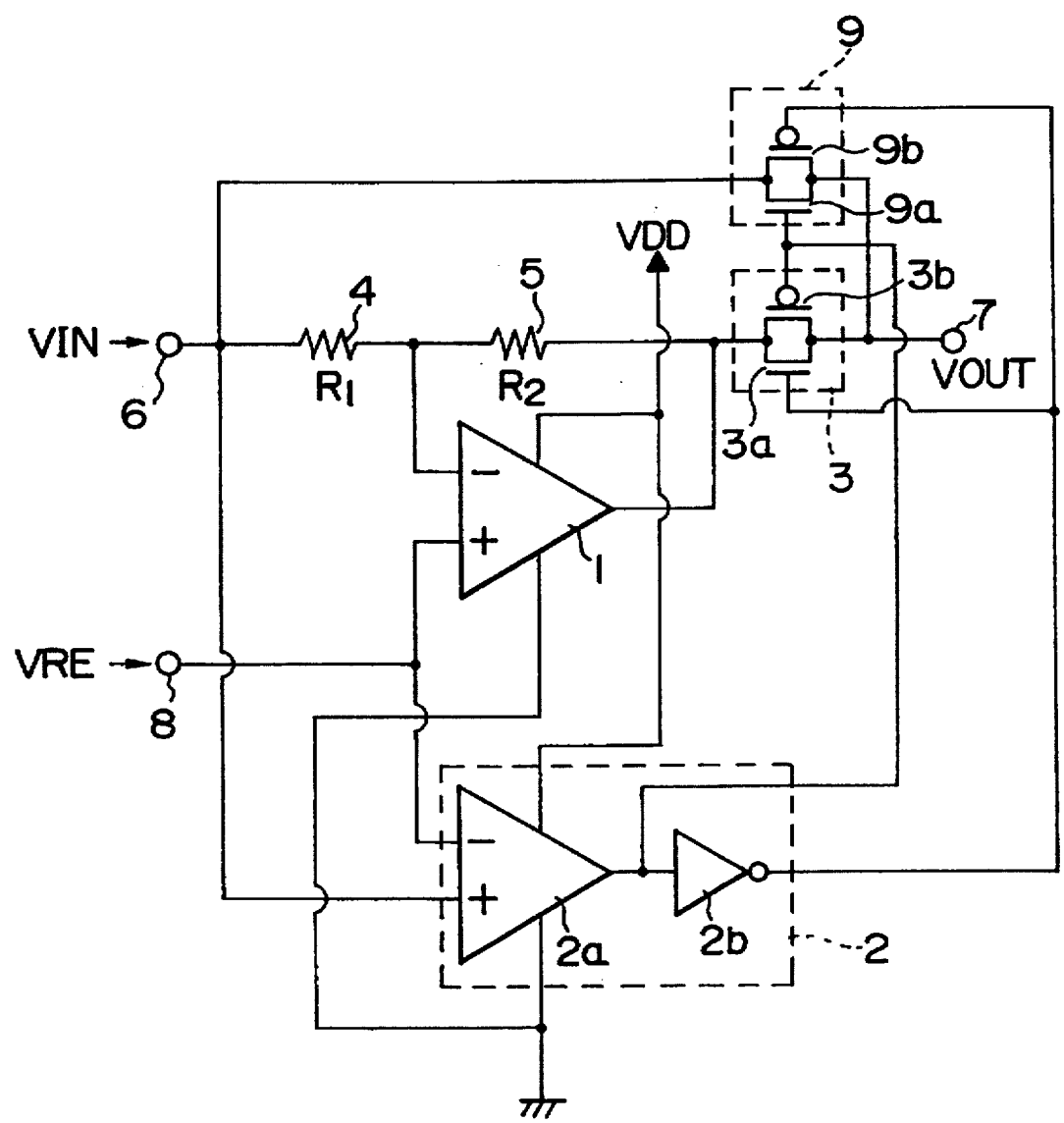
FIG. 2 is a view illustrating the configuration of an absolute value circuit according to a second embodiment of the present invention.

In FIG. 2, the same elements as those shown in FIG. 1 or elements corresponding to those shown in FIG. 1 are identified by like reference numerals and their description will therefore be omitted.

In the first embodiment, one end of the feedback resistor 5 was connected directly to the output terminal VOUT. In the second embodiment on the other hand, the one end of the feedback resistor 5 employed in the first embodiment is electrically connected to the output of the first Op Amp 1. Further, a CMOS analog switch 9, is electrically connected to an input terminal 6 and the output terminal 7.

The CMOS analog switch 9 is composed of an NMOSFET 9a and a PMOSFET 9b. The NMOSFET 9a and the PMOSFET 9b are electrically connected in parallel to each other between an input terminal 6 and the output terminal 7. The control electrode of the NMOSFET 9a is electrically connected to the output of a second Op Amp 2a. The control electrode of the PMOSFET 9b is electrically connected to the output of an inverter 2b.

The CMOS analog switch 9 is turned on or off in response to a signal outputted from the comparing circuit 2.

Described specifically, when the signal output from the second Op Amp 2a is at the ground voltage GND and the signal output from the inverter 2b is at the source voltage VDD, the CMOS analog switch 9 is turned off. On the other hand, when the output signal of the second Op Amp 2a is at the source voltage VDD and the output signal of the inverter 2b is at the ground voltage GND, the CMOS analog switch 9 is turned on.

When the CMOS analog switch 9 is turned on, the CMOS analog switch 9 electrically connects the input terminal 6 and the output terminal 7 to each other. On the other hand, when the CMOS analog switch 9 is turned off, the CMOS analog switch 9 electrically disconnects the input terminal 6 from the output terminal 7 within the same electrical path as described above.

When a CMOS analog switch 3 is turned on, the CMOS analog switch 9 is turned off. On the other hand, when the CMOS analog switch 3 is turned off, the CMOS analog switch 9 is turned on.

The operation of the absolute value circuit according to the second embodiment will now be described with reference to FIG. 2 and FIGS. 3(A) and 3(B).

The operation of the absolute value circuit when the input voltage VIN is greater than the reference voltage VRE (i.e., VIN>VRE) will first be described in a manner similar to the first embodiment.

The second Op Amp 2a outputs a signal having the source voltage VDD therefrom and the inverter 2b outputs a signal having the ground voltage GND therefrom. The control electrode of the NMOSFET 3a is supplied with the signal having the ground voltage GND and the control electrode of the PMOSFET 3b is supplied with the signal having the source voltage VDD. Thus, the CMOS analog switch 3 is turned off so as to electrically disconnect the output of the first Op Amp 1 from the output terminal 7. Further, the control electrode of the NMOSFET 9a is supplied with the signal having the source voltage VDD and the control electrode of the PMOSFET 9b is supplied with the signal having the ground voltage GND. Thus, the CMOS analog switch 9 is turned on so as to electrically connect the input terminal 6 and the output terminal 7 to each other. As a result, the input voltage VIN is supplied to the output terminal 7 through the CMOS analog switch 9 as the output voltage VOUT as it is. Thus, when VIN>VRE, the relationship between VOUT and VIN is established as VOUT=VIN.

The operation of the absolute value circuit when the input voltage VIN is lower than the reference voltage VRE (i.e., VIN<VRE) will next be described.

The second Op Amp 2a outputs a signal having the ground voltage GND therefrom and the inverter 2b outputs a signal having the source voltage VDD therefrom. The control electrode of the NMOSFET 3a is supplied with the signal having the source voltage VDD and the control electrode of the PMOSFET 3b is supplied with the signal having the ground voltage GND. Thus, the CMOS analog switch 3 is turned on to thereby electrically connect the output of the first Op Amp 1 and the output terminal 7 to each other.

Further, the control electrode of the NMOSFET 9a is supplied with the signal having the ground potential GND and the control electrode of the PMOSFET 9b is provided with the signal having the source voltage VDD). As a result, the CMOS analog switch 9 is turned off.

Now, the CMOS analog switch 3 electrically connects the output of the first Op Amp 1 and the output terminal 7 to each other regardless of a difference in voltage between both ends (the source and drain of the CMOS analog switch 3) of the CMOS analog switch 3.

Assuming now that the resistance value of the input resistor 4 and the resistance value of the feedback resistor 5 are set to R1 and R2 respectively, the output voltage VOUT supplied to the output terminal 7 is given by the following equation:

$$VOUT = -(VIN-VRE) \times R2/R1 + VRE$$

When $R1=R2$, $VOUT = -(VIN-VRE) + VRE$

Thus, when VIN<VRE, the output voltage VOUT supplied to the output terminal 7 becomes equal to a voltage obtained by adding a voltage corresponding to the absolute value of the difference between the input voltage VIN and the reference voltage VRE to the reference voltage VRE.

Thus, when the input voltage VIN is higher than the reference voltage VRE, the input voltage VIN is applied to the output terminal 7 as it is. On the other hand, when the input voltage VIN is lower than the reference voltage VRE, the output voltage supplied to the output terminal 7 becomes equal to the voltage obtained by adding the voltage equivalent to the absolute value of the difference between the input voltage VIN and the reference voltage VRE to the reference voltage VRE.

Thus, when the input voltage VIN shown in FIG. 3(A) is applied to the input terminal 6, the output voltage VOUT shown in FIG. 3(B) is applied to the output terminal 7.

In the second embodiment, the output of the first Op Amp 1 is electrically connected to a first inverting input thereof during a period in which the input voltage VIN is being supplied to the input terminal 6.

Thus, when the input voltage VIN changes from a state of VIN<VRE to a state of VIN>VRE, little noise is developed.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An absolute value circuit, comprising:

an input terminal to receive an input voltage;

an output terminal;

an input resistor;

a feedback resistor, the input resistor and the feedback resistor being coupled in series between the input and output terminals, the input resistor being coupled to the feedback resistor at an intermediate coupling node;

an operational amplifier having a first input, a second input, and an amplifier output, the first input of the operational amplifier being coupled to the intermediate coupling node, the second input of the operational amplifier receiving a reference voltage;

comparing means for determining whether or not the input voltage exceeds the reference voltage; and a switch to electrically couple the amplifier output to the output terminal and the feedback resistor when the reference voltage exceeds the input voltage and to electrically isolate the amplifier output from the output terminal and the feedback resistor when the input voltage exceeds the reference voltage, the switch being coupled to the comparing means.

2. The absolute value circuit of claim 1, wherein the switch comprises a MOSFET having a source and a drain, one of which is coupled to the amplifier output and the other of which is coupled to the output terminal.

3. The absolute value circuit of claim 1, wherein the first input of the operational amplifier is an inverting input and the second input is a non-inverting input.

4. The absolute value circuit of claim 3, wherein the comparing means comprises another operational amplifier which serves as a comparator, the another operational amplifier having an inverting input that receives the reference voltage and a non-inverting input that is coupled to the input terminal.

5. An absolute value circuit, comprising:

an input terminal to receive an input voltage;

an output terminal;

comparing means for determining whether or not the input voltage exceeds a reference voltage;

a first switch to electrically couple the input terminal to the output terminal when the input voltage exceeds the reference voltage, the first switch including a first MOSFET having a source and a drain, one of which is coupled to the input terminal and the other of which is coupled to the output terminal, the first MOSFET additionally having a gate which is coupled to the comparing means;

an operational amplifier having a first input, a second input, and an amplifier output, the second input receiving the reference voltage;

an input resistor;

a feedback resistor, the input resistor and the feedback resistor being coupled in series between the input terminal and the amplifier output, the input resistor being coupled to the feedback resistor at an intermediate coupling node, the intermediate coupling node being coupled to the first input of the operational amplifier; and a second switch to electrically couple the amplifier output to the output terminal when the reference voltage exceeds the input voltage, the second switch including a second MOSFET having a source and a drain, one of which is connected to the amplifier output and the other of which is connected to the output terminal, the second MOSFET additionally having a gate which is coupled to the comparing means.

6. The absolute value circuit of claim 5, wherein the first input of the operational amplifier is an inverting input and the second input is a non-inverting input.

7. The absolute value circuit of claim 6, wherein the comparing means comprises another operational amplifier which serves as a comparator, the another operational amplifier having an inverting input that receives the reference voltage and a non-inverting input that is coupled to the input terminal.

\* \* \* \* \*